US00RE41693E

(19) United States
(12) Reissued Patent
Gust, Jr. et al.

(10) Patent Number: US RE41,693 E
(45) Date of Reissued Patent: Sep. 14, 2010

(54) MAGNETIC SWITCHING OF CHARGE SEPARATION LIFETIMES IN ARTIFICIAL PHOTOSYNTHETIC REACTION CENTERS

(75) Inventors: John D. Gust, Jr., Mesa, AZ (US); Ana L. Moore, Scottsdale, AZ (US); Thomas Moore, Scottsdale, AZ (US)

(73) Assignee: Arizona Board of Regents, Acting for and on Behalf of, Arizona State University, Tempe, AZ (US)

(21) Appl. No.: 11/565,506

(22) Filed: Nov. 30, 2006

Related U.S. Patent Documents

Reissue of:
(64) Patent No.: 6,826,321
Issued: Nov. 30, 2004
Appl. No.: 09/806,540
Filed: Mar. 30, 2001

U.S. Applications:
(60) Provisional application No. 60/102,597, filed on Oct. 1, 1998.

(51) Int. Cl.
*G02B 6/26* (2006.01)
*G11C 13/04* (2006.01)
*H01R 33/945* (2006.01)
*F24J 2/00* (2006.01)

(52) U.S. Cl. ..... 385/15; 385/16; 385/6; 385/122; 385/24; 385/147; 385/900; 365/147; 365/215; 365/225.5; 365/234; 365/243.5; 439/577; 126/569; 126/572; 126/679

(58) Field of Classification Search ..... 385/15, 385/6, 122, 24, 147, 17, 18, 900, 16; 365/215, 365/225.5, 234, 243.5; 439/577; 126/569, 126/574, 572, 578, 618, 678, 679
See application file for complete search history.

(56) References Cited

U.S. PATENT DOCUMENTS 3,870,397 A * 3/1975 Dillon et al. ..... 385/6
3,990,776 A * 11/1976 Tseng et al. ..... 385/6
4,689,793 A * 8/1987 Liu et al. ..... 372/8

(Continued)

FOREIGN PATENT DOCUMENTS

EP 0291659 A 11/1988

OTHER PUBLICATIONS

Steiner, U.E. et al., "Magnetic Field Effects in Chemical Kinetics and Related Phenomena", Chem. Rev. (1989) 89: 51–147.

(Continued)

*Primary Examiner*—Brian M Healy
(74) *Attorney, Agent, or Firm*—Schwabe, Williamson & Wyatt

(57) ABSTRACT

Excitation of a triad artificial photosynthetic reaction center consisting of a porphyrin (P) convalently linked to a fullerene electron acceptor ($C_{60}$) and a carotenoid secondary donor (C) leads to the formation of a long-lived $C^{+}$-P-$C_{60}^{-}$ charge-separated state via photoinduced electron transfer. This reaction occurs in a frozen organic glass down to at least 8 K. At 77 K, charge recombination of $C^{*+}$-P-$C_{60}^{-}$ occurs on the μs time scale, and yields solely the carotenoid triplet state. In the presence of a small (20 mT) static magnetic field, the lifetime of the charge-separated state is increased by 50%. This is ascribed to the effect of the magnetic field on interconversion of the singlet and triplet biradicals. At zero field, the initially formed singlet biradical state is in equilibrium with the three triplet biradical sublevels, and all four states have comparable populations. Decay to the carotenoid triplet only occurs from the three triplet sublevels. In the presence of the field, the S and $T_0$ states are still rapidly interconverting, but the $T_+$ and $T_-$ states are isolated from the other two due to the electronic Zeeman interaction, and are not significantly populated. Under these conditions, recombination to the triplet occurs only from $T_0$, and the lifetime of the charge-separated state increases. This effect can be used as the basis for a magnetically controlled optical or optoelectronic switch (e.g. AND gate).

62 Claims, 6 Drawing Sheets

U.S. PATENT DOCUMENTS

| | | | | | |
|---|---|---|---|---|---|
| 4,806,995 | A | | 2/1989 | Day et al. | 365/153 X |
| 5,011,907 | A | * | 4/1991 | Beratan | 528/220 |
| 5,331,183 | A | | 7/1994 | Sariciftci et al. | 257/40 |
| 5,512,193 | A | * | 4/1996 | Shirai et al. | 252/62.57 |
| 5,539,100 | A | | 7/1996 | Wasielski et al. | 340/145 |
| 5,698,048 | A | | 12/1997 | Friend et al. | 136/263 |
| 5,707,845 | A | | 1/1998 | Ueyama et al. | 435/189 |
| 5,933,269 | A | * | 8/1999 | Robinson | 359/280 |
| 6,005,791 | A | * | 12/1999 | Gudesen et al. | 365/114 |
| 6,034,938 | A | * | 3/2000 | Heanue et al. | 369/13.56 |
| 6,647,163 | B2 | * | 11/2003 | Song | 385/15 |
| 6,826,321 | B1 | * | 11/2004 | Gust et al. | 385/15 |
| 6,868,196 | B2 | | 3/2005 | Hanneman | 385/14 |
| 2003/0002767 | A1 | * | 1/2003 | Hanneman, Jr. | 385/5 |

OTHER PUBLICATIONS

Grisson, C.B., "Magnetic Field Effects in Biology: A Survey of Possible Mechanisms with Emphasis on Radical–Pair Recombination", Chem. Rev. (1994) 95: 3–24.

Ulrich E. Steiner, et al., "Magnetic Field Effects in Photochemistry" vol. IV, Rabek, J.F., Ed; CRC: Boca Raton, FL, (1991): 1–130.

Hayashi, H. "Magnetic Field Effects On dynamic Behavior and Chemical Reactions of Excited Molecules" vol, rabek, J.F., Ed.; CRC: Boca Raton, FL, (1990): 59–136.

Hoff, A.J. et al., "On The Magnetic Field Dependence of the Yield of the Triplet State Bacteria", Biochmica at Biophsyica Acta (1977) 460: 547–554.

Blankenship, R.E. et al., "Magnetic Field Effects on Radical Pair Intermediates in Bacterial Photosynthesis", Biochimica at Biophysica Acta (1977) 461: 297–305.

Blankenship, R.E., "Chemically Induced Magnetic Polanzation in Photosynthetic Systems" American Chemical Society. (1981) 14: 163–170.

Hoff, A.J., "Magnetic Interactions Between Photosynthetic Reactants", Photochemistry and Photobiology, (1986) vol. 43: 727–745.

Boxer, S.G. et al., "Use of Large Magnetic Fields Reactions", J. Am. Chem. Soc. (1982) 104: 1452–1454.

Boxer, W.G. et al., "Dependence of the Yield of Field", J. Am. Chem. Soc. (1982) 104: 2674–2675.

Liddell, P.A. et al., "Photoinduced Charge Sepration Fullerene Triad", J. Am. Chem. Soc. (1977) 119: 1400–1405.

Carbonera, et al., "EPR Investigation of Photoinduced Radical . . . Triad", J. Am. Chem. Soc. (1998) 120: 4398–4405.

Grant, J.L. et al., "Carotenoid Cation Radicals", J. Am. Chem. Soc. (1988) 110: 2151–2157.

Hasharoni, K. et al., "Singlet Photochemistry in Model Photosynthesis", J. Am. Chem. Soc. (1990) 112: 6477–6481.

Van Duk, B. et al., "Magnetic Field Effects on the Recombination Kinetics of Radical Parts", J. Phys. Chem. 8 (1998) 102: 464–472.

Werner U. et al., "Magnetic Field Effects in the Radical Ion . . . Acceptor", J. Phys. Chem (1995) 99: 13930–13937.

Saito, T. et al., "Long–Lived Triplet Radical Ion Pair . . . Lifetime", Bull. Chem. Soc. Jpn. (1988) 61: 1925–1931.

Nakamura, H. et al., "Reaction Control of Photoinduced Electron . . . Fields", Chem. Lett. (1987): 543–546.

Weller, A. et al., "A Quantitative Interpretation . . . Ion Pairs", Chem. Phys. Lett. (1983) 96: 24–27.

Piekera–Sady, L. et al., "Comparison of the INDO to the RHF–INDO/SP . . . Radical", Chem. Phys Lett. (1991), 186: 143–148.

Lin, S. et al., "Time–Resolved Spectroscopy of Energy and Elctron . . . Heliobacilius mobilis", Biophysical Journal (1994) 66: 437–445.

Davis, F.S. et al., "Digital back off for computer controlled flash spectometers". Rev. Sc. Instrum. (1987) 58: 1629–1631.

Gust, D. "In Recent Advances in the Chemistry and Physics of Fullerenes and Related Materials", Kadish, K.M., Rutherford, A.W., Eds. The Electrochemical Society; Pennington, NJ, (1997): 9–24.

G.L. Closs, "Chemically Induced Dynamic Nuclear Polarization", Department of Chemistry, The University of Chicago, Illinois, (1974) 7: 157–229.

Office Action, mailed Feb. 12, 2003, for U.S. Appl. No. 09/806,540.

Office Action, mailed Feb. 5, 2004, for U.S. Appl. No. 09/806,540.

International Search Report, mailed Jan. 11, 2000, for PCT/US99/23012.

Search Report, mailed Nov. 9, 2001, for EP Patent Application 999969851.7.

Kuciauskas et al., "Magnetic Switching of Charge Separation Lifetimes in Artifical Photosynthetic Reaction Centers", J. AM. Chem. SOC., vol. 120, Oct. 10, 1998, pp. 10880–10886.

* cited by examiner

MAGNETIC SWITCHING OF CHARGE SEPARATION LIFETIMES IN ARTIFICIAL PHOTOSYNTHETIC REACTION CENTERS

Matter enclosed in heavy brackets [ ] appears in the original patent but forms no part of this reissue specification; matter printed in italics indicates the additions made by reissue.

This application is a National Stage (371) of PCT/US99/23012, filed Oct. 1, 1999, which claims benefit of U.S. Provisional Application No. 60/102,597, filed Oct. 1, 1998. +gi Financial assistance for this project was provided by U.S. Government through the National Science Foundation under Grant Number CHE-9709272; and the United States Government may own certain rights to this invention.

FIELD OF THE INVENTION

The present invention relates generally to the effects of magnetic fields on the lifetimes of radical pairs formed generally by photoinduced electrons transfer and the corresponding yields of the products of radical pair decay and more particularly to the magnetic switching of charge separation lifetimes in artificial photosynthetic reaction centers.

BACKGROUND ART

The effects of magnetic fields on the lifetimes of radical pairs formed by photoinduced electron transfer and the corresponding yields of the products of radical pair decay have been studied for many years. (Steiner, U. E. et al. Chem. Rev. 1989, 89, 51–147.; Steiner, U. E. et al. Photochemistry and Photophysics, Vol IV; Rabek, J. F., Ed.; CRC: Boca Raton, Fla., 1991; pp 1–130.; Hayashi, H. In Photochemistry and Photophysics, Vol I; Rabek, J. F., Ed.; CRC: Boca Raton, Fla., 1990; pp 59–136.; Grissom, C. B. Chem. Rev. 1995, 95, 3–24). These effects arise because the field can affect the rates of interconversion among the singlet radical pair and the three sublevels of the triplet radical pair. The observation of such effects requires two apparently contradictory conditions. In order for photoinduced electron transfer to occur from an excited singlet state, the electronically excited electron donor (acceptor) and the ground-state acceptor (donor) must experience relatively strong electronic coupling so that electron transfer can compete kinetically with the other decay pathways available to the excited state. However, such strong coupling generally precludes the interconversion of the singlet and triplet radical pair states necessary for the development of magnetic field effects. Both conditions may be satisfied sequentially by allowing diffusional processes to bring together the donor and acceptor, thus promoting rapid photoinduced electron transfer. Diffusion can then separate the radical pairs, reducing coupling and allowing singlet-triplet interconversion. Thus, magnetic field effects are generally observable in radical pair systems wherein the donors and acceptors freely diffuse in solution, or in biradicals where the radicals are linked by flexible chains such as polymethylene groups so that large-scale internal motions are facile.

Because of these restrictions, rigid donor-acceptor assemblies, or those in media such as low-temperature glasses or plastics where molecular motions are restricted, typically do not demonstrate magnetic field effects on radical pairs originating from excited singlet state precursors. This hinders the use of such effects in the design of molecular-scale electronic components that must function in rigid media. The conundrum can be avoided by employing a multistep electron transfer strategy whereby the electron is moved from the primary donor to the ultimate acceptor via intermediate donor-acceptor species. In this way, the electronic coupling between adjacent donor-acceptor pairs is strong enough so that each electron transfer step is rapid and can compete with other decay pathways, resulting in a high yield of the final charge-separated state. At the same time, the electronic coupling between the donor and the ultimate acceptor is small, and this can allow rapid singlet-triplet interconversions and consequently magnetic field effects.

The preeminent example of this phenomenon is photosynthesis, where a number of different magnetic field effects on reaction yields and rates have been observed, (see: Blankenship, R. E. et al. Biochim. Biophys. Acta 1977, 461, 297–305.; Blankenship, R. E. Acc. Chem. Res. 1981, 14, 163–170.; Hoff, A. J. et al. Biochim. Biophys. Acta 1977, 460, 547–554.; Hoff, A. J. Photochem. Photobiol. 1986, 43, 727–745.; Boxer, S. G. et al. J. Am. Chem. Soc. 1982, 104, 1452–1454.; Boxer, S. G. et al. J. Am. Chem. Soc. 1982, 104, 2674–2675.; van Dijk, B. et al. J. Phys. Chem. B 1998, 102, 464–472). In the case of photosynthetic model systems, magnetic-field-dependent nonexponential decays of biradical states at room temperature have been reported in diporphyrin-imide triad molecules, (see: Werner, U. et al. J. Phys. Chem 1995, 99, 13930–13937). Small magnetic fields increased the initial rate of decay of the biradical to the ground state by charge recombination. Magnetic field effects have also been reported in dyads consisting of porphyrins linked to viologen electron acceptors by flexible chains. (Saito, T. et al. Bull. Chem. Soc. Jpn. 1988, 61, 1925–1931.; Nakamura, H. et al. Chem. Lett. 1 987, 543–546). In these reported cases, the photoinduced electron transfer originates from the porphyrin excited triplet state, rather than the singlet.

Recently reported (see: Liddell, P. A. et al. J. Am. Chem. Soc. 1997, 119, 1400–1405.; Carbonera, D. et al. J. Am. Chem. Soc. 1998, 120, 4398–4405; Gust, D. et al. In Recent Adavances in the Chemistry and Physics of Fullerenes and Related Materials; Kadish, K. M., Rutherford, A. W., Eds.; The Electrochemical Society: Pennington, N.J., 1997; pp 9–24) is the preparation and study of a carotenoid (C) porphyrin (P) fullerene ($C_{60}$) triad artificial photosynthetic reaction center (1), shown below, that demonstrates photoinduced electron transfer behavior ideally suited for the observation of unusual magnetic field effects. Excitation of the porphyrin moiety yields C-$^1$P-$C_{60}$, which decays by photoinduced electron transfer to give C-P$^+$-$C_{60}$$^{*-}$. Secondary electron transfer from the carotenoid to the porphyrin radical cation produces the C$^{*+}$-P-$C_{60}$$^{*-}$ charge-separated state. This process occurs even in low-temperature organic glasses where molecular motions and some electron spin relaxation processes are slowed. In addition, charge recombination yields only the carotenoid triplet state, $^3$C-P-$C_{60}$, rather than the molecular ground state. As discussed below, this combination of properties results in a lifetime for the C$^{*+}$-P-$C_{60}$$^{*-}$ charge-separated state on tile microsecond time scale that is increased by 50% upon application of a weak magnetic field.

1

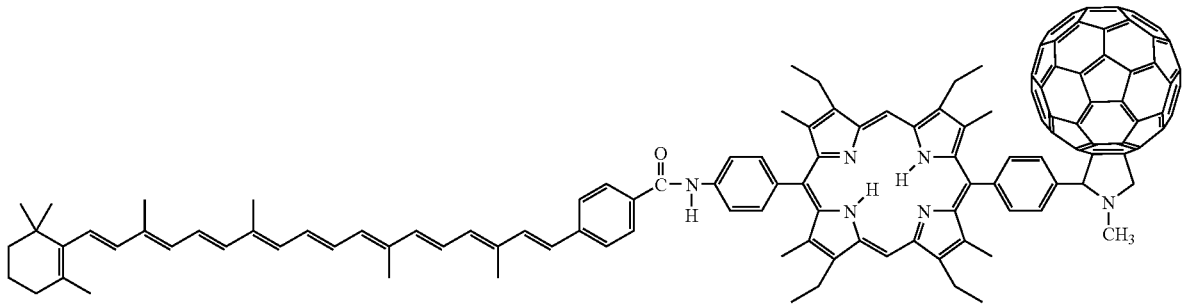

DISCLOSURE OF INVENTION

The magnetically activated optoelectronic switch as herein described and illustrated can be used in several applications. For example, it can be configured as an AND logic gate, AND logic gate, or other form of logic gate. In this configuration, it is used as a molecular-scale logic element in an optoelectronic computer processor. AND gates, either alone or in combination, can perform all logic operations necessary for computer data processing. By using a gate of molecular dimensions, the size, cost and power requirements of computer processors could be reduced, and their speed increased.

Such molecular-scale switches can also be used in optical or optoelectronic communications applications. In this case, the light which forms one of the inputs of the device can be from a fiber optic communication line, and the magnetic input provided by conventional electronic means.

A unique feature of this switch is that it is sensitive to inputs having different physical properties. One input is electromagnetic radiation in the ultraviolet or visible wavelength range and the other input is a magnetic field. This allows information transmitted in different media to be combined and processed.

Alternatively, the device can be configured as a computer memory element that can be switched between "on" and "off" binary states using a combination of light and magnetic fields. The density of data storage in such molecular-scale memories will be much higher than in conventional electronic memories, and the access speed will be extremely high. Such memories would have to be refreshed as a function of the lifetime of the charge-separated state.

BEST MODE FOR CARRYING OUT THE INVENTION

Figure 1:
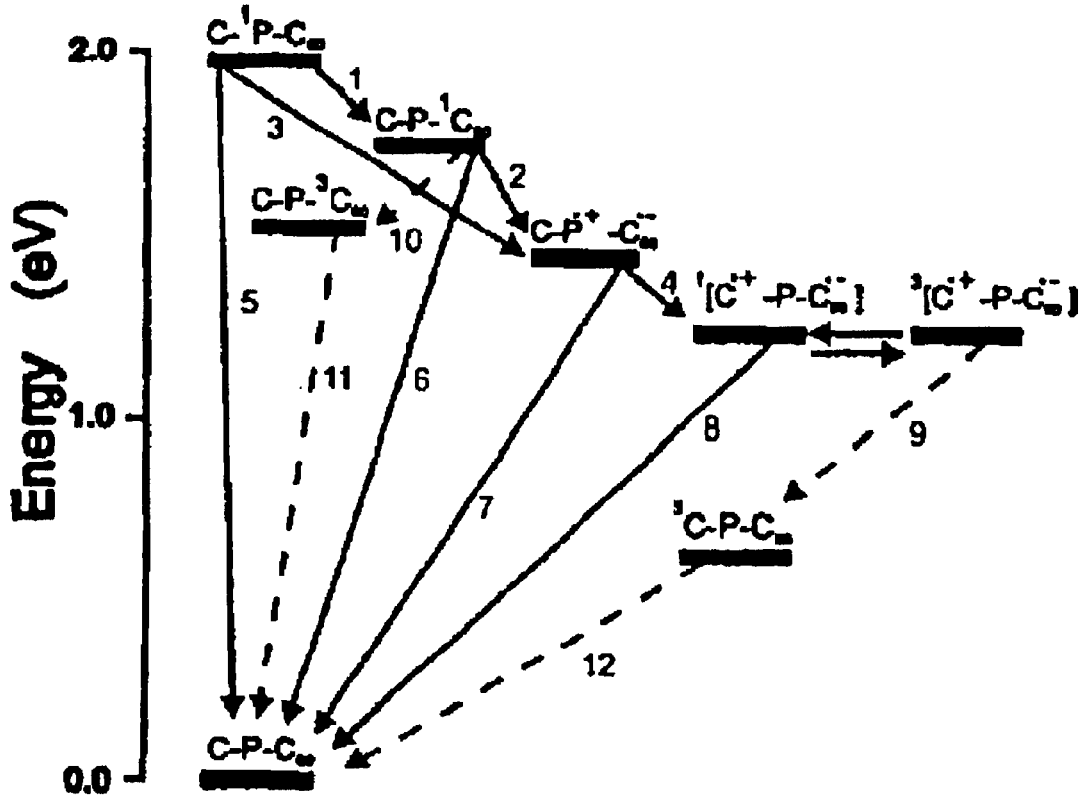
FIG. 1 shows the high-energy states of C-P-$C_{60}$ triad 1 and their relevant interconversion pathways at 77 K in which the energies were estimated from spectroscopic results at ambient temperature and from cyclic voltammetric experiments carried out on suitable model compounds in polar solvents at ambient temperatures. (Liddell, P. A. et al. J. Am. Chem. Soc. 1997, 119, 1400–1405). These energies have not been corrected for any coulombic effects.

Photochemistry at Ambient Temperatures. The synthesis and characterization of triad 1 has been previously reported. Liddell, P. A. et al. J. Am. Chem. Soc. 1997, 119, 1400–1405. The photochemistry of the triad may be discussed with reference to FIG. 1, which shows the relevant high-energy states and decay pathways. Time-resolved spectroscopic studies have shown that at ambient temperatures in 2-methyltetrahydrofuran solution, excitation of the porphyrin moiety yields C-$^1$P-$C_{60}$, which decays in 10 ps by photoinduced electron transfer to the fullerene to generate C-$P^{*+}$-$C_{60}^{*-}$ (step 3 in the Figure, $k_3=1.0\times10^{11}$ $s^{-1}$). The fullerene excited singlet state accepts an electron from the porphyrin to also yield C-$P^{*+}$-$C_{60}^{*-}$ ($k_2=3.1\times10^{10}$ $s^{-1}$). The overall quantum yield of C-$P^{*+}$-$C_{60}^{*-}$ by these two pathways is essentially unity. Secondary electron transfer from the carotenoid (step 4) competes with charge recombination by step 7 to yield the final $C^{*+}$-P-$C_{60}^{*-}$ charge-separated state. The rise time of this state is 80 ps, and the overall yield is ~0.14, as determined by the comparative method with the meso-tetraphenylporphyrin triplet state ($\phi_T=0.67$, $(\epsilon_T-\epsilon_G)_{440}=6.8\times10^4$ L $mol^{-1}$ $cm^{-1}$) as a standard, and using an extinction coefficient of $1.6\times10^5$ L $mol^{-1}$ $cm^{-1}$ for the carotenoid radical cation. The $C^{*+}$-P-$C_{60}^{*-}$ state decays exponentially in 170 ns exclusively by charge recombination to produce the carotenoid triplet state ($\Phi_t$=0.13). Decay of $^3$C-P-$C_{60}$ occurs in 4.9 μs ($k_{15}$=2.0×10$^5$ s$^{-1}$). The application of a small (up to 41 mT) magnetic field to the sample at ambient temperatures had no effect on either the yield or the lifetime of the charge-separated state.

Photochemist at 77 K in the Absence of a Magnetic Field. Excitation of a ~1×10$^{-4}$ M solution of 1 in a 2-methyltetrahydrofuran glass at 77 K with a 590 nm, 5 ns laser pulse gave rise to several transient species. (Liddell, P. A. et al. J. Am. Chem. Soc. 1997, 119, 1400–1405). A transient absorption with a maximum at 700 nm corresponding to the fullerene triplet state was observed. The quantum yield of C-P-$^3C_{60}$, was 0.17, as determined by the comparative method, and it decayed with a time constant of 81 μs. At the excitation wavelength, ~19% of the light is absorbed by the fullerene moiety, and the quantum yield of triplet in model fullerene compounds is essentially unity. Thus, C-P-$^3C_{60}$ is postulated to form by normal intersystem crossing via step 10 in FIG. 1. This conclusion has been borne out by time-resolved epr experiments that confirm the intersystem crossing mechanism. (Carbonera, D. et al. J. Am. Chem. Soc. 1998, 120, 4398–4405).

Figure 2:
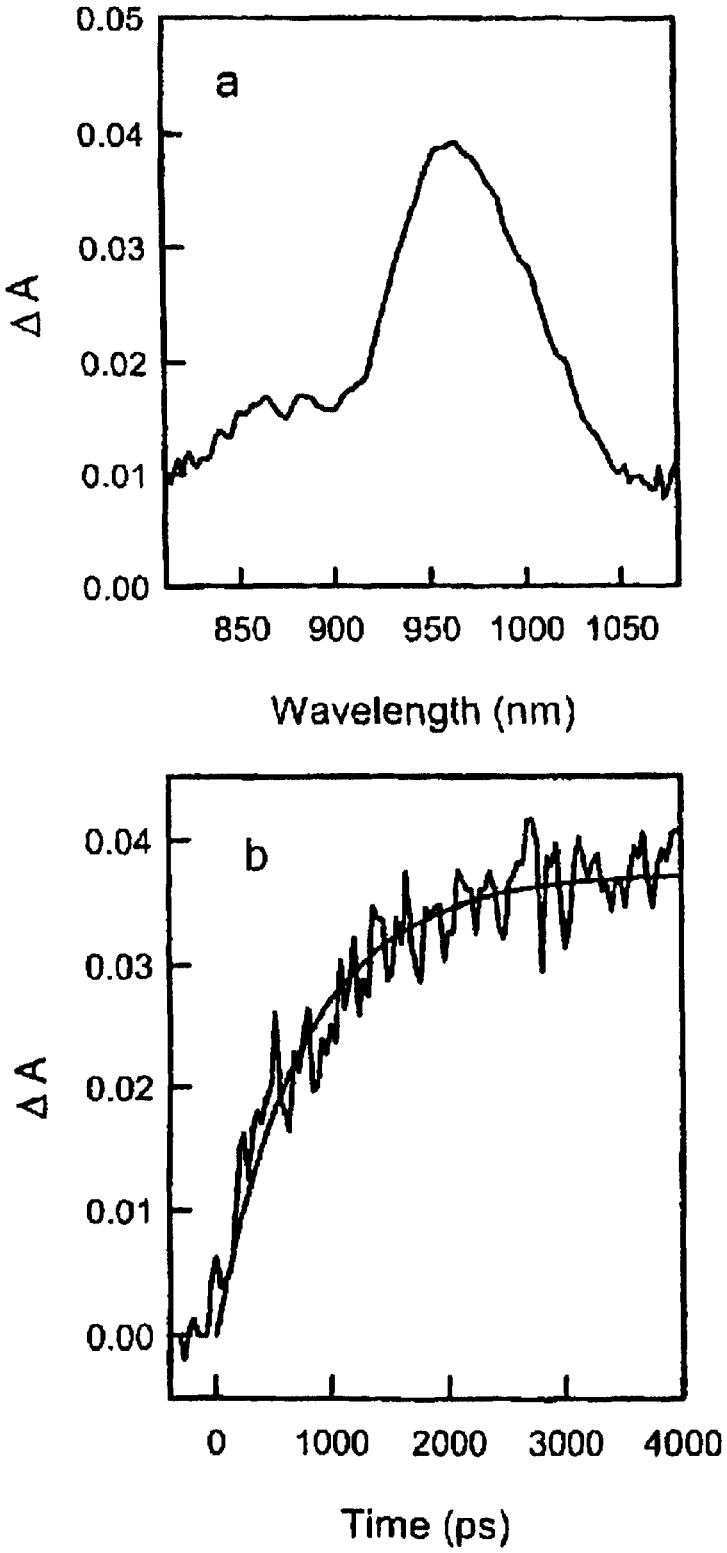
FIG. 2(a) shows the transient absorption spectrum of $C^{*+}$-P-$Q^{*-}$ taken 3,950 ps after excitation of a ~$1\times10^{-3}$ M solution of 1 in a 2-methyltetrahydrofuran glass at 77 K with a 150 fs, 20 nJ laser pulse at 575 nm.
FIG. 2(b) shows the rise of the absorption in part (a), determined at 950 nm and the smooth curve is an exponential fit to the rise data with a time constant of 770 ps.

The nanosecond time-resolved absorption experiments also reveal a transient absorption with a maximum at 965 nm corresponding to the carotenoid radical cation of the C$^{*+}$-P-$C_{60}^{*-}$ charge-separated state. The quantum yield is ~0.10, based on total light absorbed and using the extinction coefficients reported for the tetraphenylporphyrin triplet state and carotenoid radical cations at ambient temperatures. Transient absorption experiments carried out under similar conditions with subpicosecond excitation at 575 nm using the pump-probe technique gave a rise time for C$^{*+}$-P-$C_{60}^{*-}$ of 770 ps at 77 K (FIG. 2). This rise time is presumably the reciprocal of ($k_4$+$k_7$) at this temperature.

Figure 3:
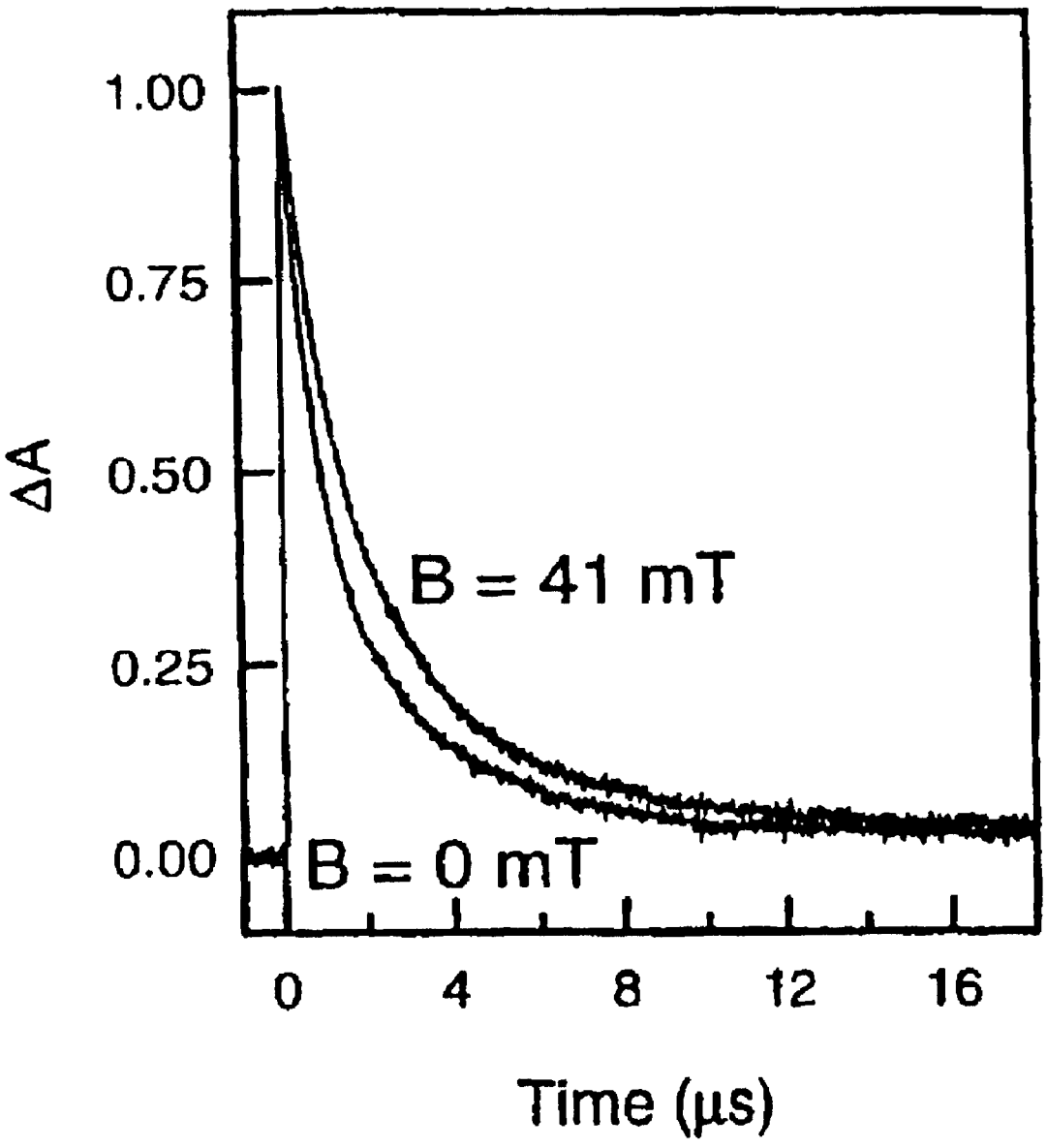
FIG. 3 shows the decay of the transient absorption of the $C^{*+}$-P-$C_{60}^{*-}$ charge-separated state in a 2-methyltetrahydrofuran glass at 77 K, monitored at 980 nm where the carotenoid radical cation absorbs strongly, and the excitation was at 575 nm with a ~5 ns laser pulse. The lower, more rapidly decaying transient was obtained at zero magnetic field, and the upper, more slowly decaying signal at 41 mT. The smooth curves passing through the experimental data are best fits of the data in the time window shown using three exponential components, as described in the disclosure.

The decay of the carotenoid radical cation absorption of C$^{*+}$-P-$C_{60}^{*-}$ occurs on the μs time scale, and is shown in FIG. 3. It is accompanied by the rise of a new transient with a maximum absorbance at ~550 nm whose rise kinetics are identical to the decay kinetics of the carotenoid radical cation. The new state is ascribed to $^3$C-P-$C_{60}$ generated by charge recombination of the C$^{*+}$-P-$C_{60}^{*-}$ biradical. It is formed with a quantum yield of ~0.07 based on ambient-temperature extinction coefficients, which is comparable to the yield of C$^{*+}$-P-$C_{60}^{*-}$, within experimental error. The decay can be fit within the noise limits with two exponentials. The major component has a time constant of 10 μs, which is a typical lifetime for a carotenoid triplet state, and the lifetime of the minor component is 83 μs. The similarity of the minor component lifetime to that for C-P-$^3C_{60}$ suggests that it may be due to some absorption of the fullerene triplet state at 550 nm.

The 980-nm absorption of C$^{*+}$-P-$C_{60}^{*-}$ at 77 K does not decay as a single exponential, in contrast to the behavior at ambient temperatures. In order to compare these results with those obtained in the presence of a magnetic field, The "average" decay rate, $k_{avj}$, for the illustrated time window is defined by eq 1, where A, A' and A" are the amplitudes of three exponential decay components with rate constants $$k_{avg} = \frac{Ak + A'k' + k''A''}{A + A' + A''} \tag{1}$$

k, k', and k". For example, at zero field, the decay may be fitted over the time window shown in FIG. 3 with two exponential components of 1.0 μs (60% of the decay) and 2.5 μs (37%) and very slowly decaying component with an amplitude of 3%. Thus, the $k_{avg}$ value for 1 is 7.5×10$^5$ s$^{-1}$ in the absence of an applied magnetic field. Using different time windows yields slightly different combinations of time constants and amplitudes.

Photochemistry at 77 K in the Presence of a Magnetic Field. Identical experiments at 77 K on the nanosecond time scale were carried out in the presence of a weak (41 mT), steady-state magnetic field (B) applied before excitation. The yield of C$^{*+}$-P-$C_{60}^{*-}$ under these conditions was essentially identical to the yield at its B=0. The decay of the charge-separated state, however, was significantly slower than in the absence of a magnetic field (FIG. 3). Application of eq 1 to these data yields a $k_{avg}$ value of 5.0×10$^5$ s$^{-1}$ in a 41 mT field.

Figure 4:
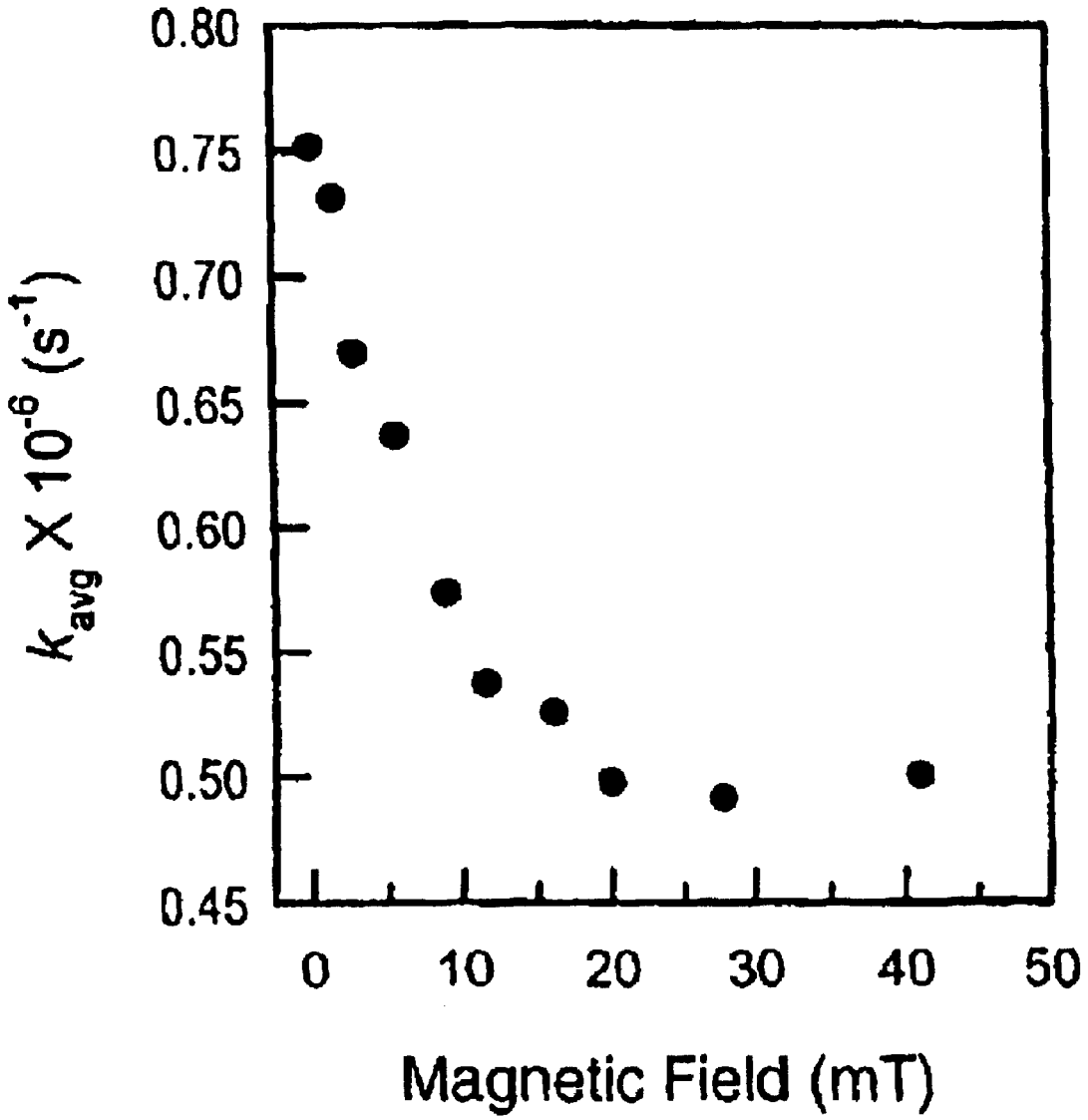
FIG. 4 shows the dependence of $k_{avg}$, as defined by eq 1, on magnetic field strength at 77 K.
Figure 5:
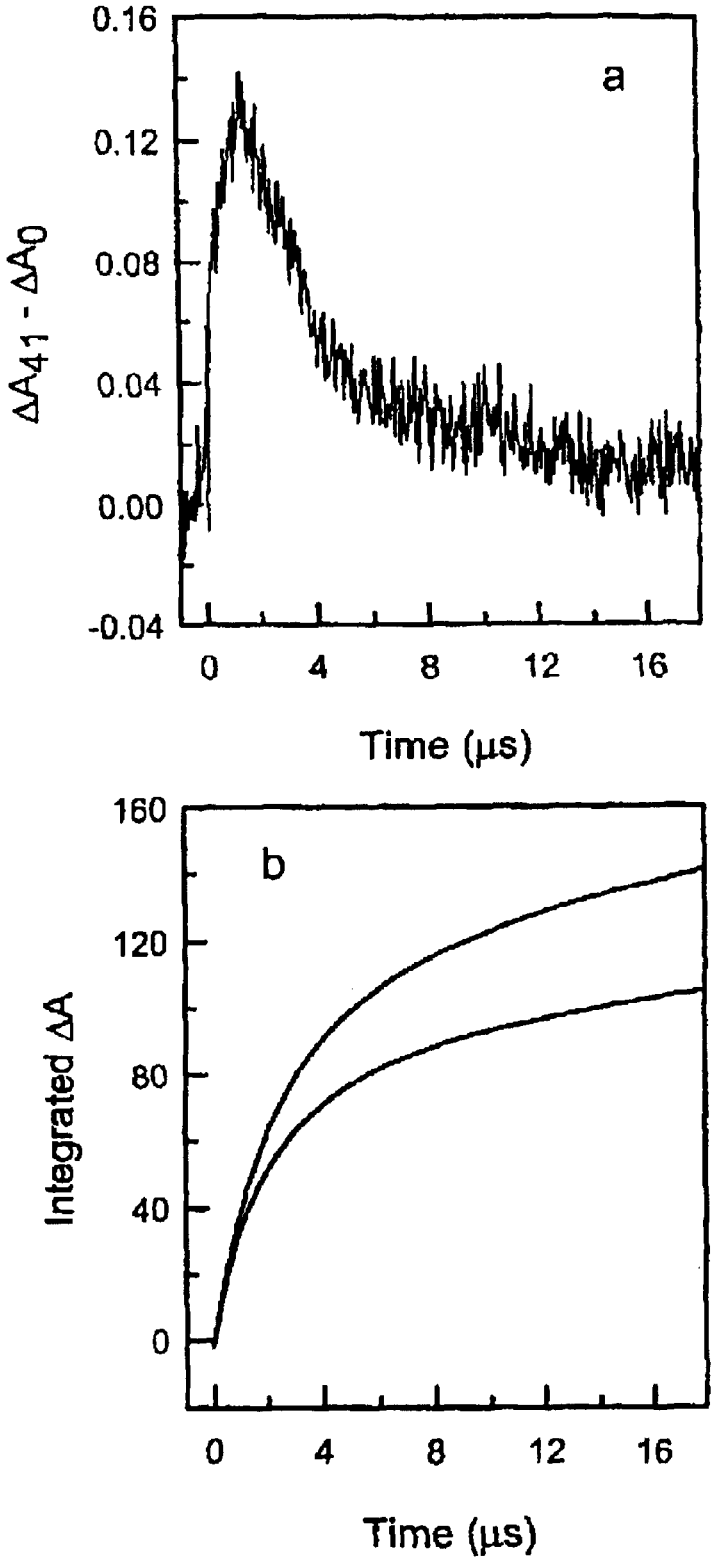
FIG. 5(a) shows the transient absorbance at 980 nm of a solution of 1 in 2-methyltetrahydrofuran at 77 K determined at 41 mT minus that determined at zero magnetic field which represents the difference of the two curves shown in FIG. 3.
FIG. 5(b) shows the integral of the transient absorbance at 980 nm of a solution of 1 in 2-methyltetrahydrofuran at 77 K, determined at 41 mT (upper curve) and zero field (lower curve) and represents the integrals of the two curves in FIG. 3 over time.

The magnetic field dependence of $k_{avg}$ is shown in FIG. 4. The effect on the lifetime of the biradical saturates at a few tens of mT; the field strength for half-saturation, $B_{1/2}$, is 6.4 mT. The time dependence of the difference in the transient absorption of the biradical at zero field and at saturating magnetic field effect may be quantified by subtracting the decay curve in the absence of field from that obtained at 41 mT. The resulting curve (FIG. 5a) shows that the maximum difference in concentration of the charge-separated states, as a function of time, occurs 1.3 μs after the excitation pulse. The total difference in response of the triad to the two field strengths is conveniently illustrated and quantified by integrating the two transient absorptions over their lifetimes (FIG. 5b).

The yield of the carotenoid triplet species, $^3$C-P-$C_{60}$, arising from charge recombination was determined at zero field and at saturating field (41 mT), and no differences outside of experimental error were observed. In addition, the rise kinetics of the carotenoid triplet state at 0 mT and 41 mT were identical with the decay kinetics of the carotenoid radical cation. Thus, the carotenoid triplet state is the only significant product of charge recombination at all field strengths investigated. The carotenoid triplet state lifetime at 77 K was independent of the magnetic field.

The 50% increase in the lifetime of the C$^{*+}$-P-$C_{60}^{*-}$ charge-separated state resulting from the application of a relatively weak static magnetic field may be explained by reference to the simple and well-known kinetic scheme in FIG. 6, which shows the singlet biradical state, the three triplet biradical sublevels, and the pathways that interconvert and depopulate them. The rapid (770 ps) formation of the C$^{*+}$-P-$C_{60}^{*-}$ state at 77 K ensures that its excited state precursor is the porphyrin first excited singlet state, rather than the triplet. Thus, C$^{*+}$-P-$C_{60}^{*-}$ is formed as a singlet biradical. It has been previously determined by time resolved epr spectroscopy that the exchange interaction energy between the two electrons of the biradical is very small (J=0.12 mT). In this case, the spin Hamiltonian H can be divided into four parts, (Closs, G. L. Advan. Magn. Reson. 1974, 7, 157–229).

$$H = \beta B_0(g_1 S_1 + g_2 S_2) - J\left(\frac{1}{2} + 2S_1S_2\right) + \sum_i a_{1i}S_1I_i + \sum_k a_{2k}S_2I_k \tag{2}$$

where β is the Bohr magneton, $B_0$ is the applied magnetic field, $g_1$ and $g_2$ are the electronic g-factors for each radical, $S_1$ and $S_2$ are electron spin operators for the two components of the biradical, J is the scalar exchange interaction constant, $I_i$ and $I_k$ are nuclear spin operators, and $a_{1i}$ and $a_{2k}$ are the isotropic hyperfine coupling constants of nucleus i with radical 1 and nucleus k with radical 2. The first term in eq 2 accounts for the different electronic Zeeman interactions of the two radicals with the magnetic field. The second tern represents the scalar coupling interaction of 2J, and the last two terms allow for the isotropic hyperfine coupling interactions of magnetically active nuclei (mainly protons) with the electron spins. It is assumed that nuclei associated structurally with a given radical couple only with that radical; this is justified when J is very small.

The singlet biradical S (FIG. 6) can in principle decay by charge recombination ($k_0$, which is identical to $k_8$ in FIG. 1), or interconvert with the $T_0$ ($k_0$), or $T_+$ and T−($k_b$) states. The three triplet sublevels can interconvert via $k_c$, and each can undergo charge recombination to yield the carotenoid triplet state with a rate constant $k_T$.

Figure 6:
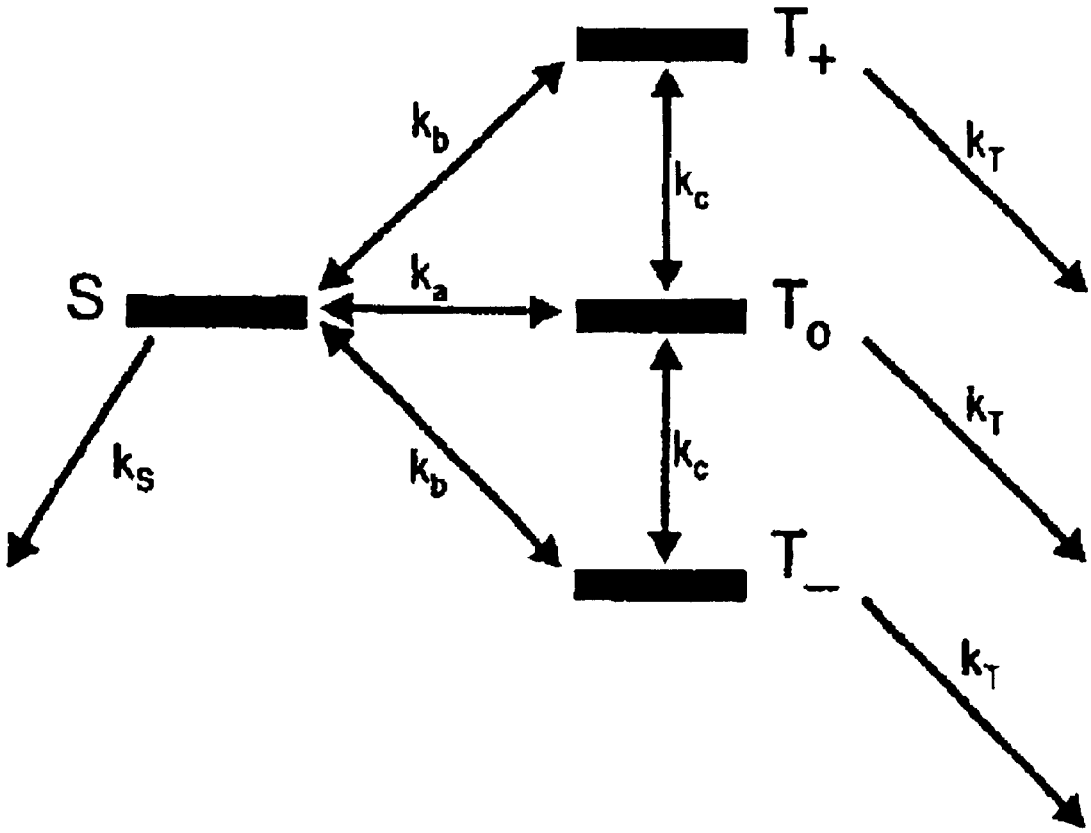
FIG. 6 shows a schematic representation of the singlet biradical, the three triplet sublevels of the biradical, and their decay and interconversion pathways.

At zero applied field, the first term in eq. 2 vanishes, and the energies of all four states in FIG. 6 are nearly degenerate when the exchange interaction energy is very small, as in 1. It is postulated that as a result, interconversion among all four states via hyperfine coupling interaction (HFI)-induced intersystem crossing is rapid on the time scale of charge recombination. The resulting equilibrium leads to a population that is 25% singlet biradical and 75% triplet. The experimental results show that this population decays only within the triplet manifold ($k_S << k_T$), yielding $^3$C-P-$C_{60}$ as the sole product. Under these conditions, and assuming all $k_T$ values to be equal, the decay of the charge-separated state is given by $$\frac{d[BR]}{dt} = \frac{-3[BR]}{4} k_T \tag{3}$$

where [BR] is the total concentration of the biradical. The charge-separated state will decay by step 9 in FIG. 1 with an observed first order rate constant $k_9 = 3k_T/4$.

At saturating applied magnetic field strengths, the Zeeman interaction of the spins with the external magnetic field (first term in eq 2) removes the near-degeneracy of the triplet sublevels, increasing the energy of $T_+$ and decreasing that of T− by an equal amount. Under these conditions, the mixing between $T_0$ and S is much stronger than the mixing among any other electronic states. At 77 K, it is postulated that on the time scale of biradical recombination, the interconversion of the S and $T_0$ levels is still rapid. However, interconversion between these states and $T_+$ and T− by any relaxation mechanism is now much slower than charge recombination, and the $T_+$ and T− states are in effect isolated from the other two. Under these conditions, $C^{*+}$-P-$C_{60}^{*-}$, which is born as a singlet biradical, rapidly equilibrates with $T_0$, but $T_+$ and T− are not significantly populated. When the field is present, the decay of the biradical is given by $$\frac{d[BR]}{dt} = \frac{-[BR]}{2} k_T \tag{4}$$

and the first order decay constant $k_9$ is $k_T/2$. Thus, the observed $k_9$ at zero field will equal 1.5 times $k_9$ at a saturating field strength. This result corresponds to what is observed experimentally, as $k_{avg}$ at zero field is indeed 1.5 times that at a saturating field.

It was noted that the decays at 77 K are not single exponentials. This is ascribed, for the most part, to the likelihood that in the frozen medium, a variety of molecular microenvironments and a variety of slightly different molecular conformations exist, and that these have slightly different recombination rates. Thus, although the data may be fit, within experimental error, by two exponentials and a small baseline offset, the true kinetic description is likely better described as a distribution of decays. In this connection, it is interesting to note that both k and k' in eq 1 are larger by a factor of ~1.5 in the absence of a magnetic field. Thus, the molecules in the great majority of the postulated microenvironments respond in the same way to the presence of the field.

It is worthwhile to briefly examine a few of the postulates underlying the above explanation. As determined by epr spectroscopy, the coupling J between the electron spins in $C^{*+}$-P-$C_{60}^{*-}$ is +0.12 mT. This means that the $T_0$ state lies $2.7\times10^{-8}$ eV below the singlet state. The zerofield splitting between the triplet states must be of this general magnitude as well. At 77 K, thermal energies are ~$6.6\times10^{-3}$ eV. Thus, the assumption that when in equilibrium at zero field, the four energy levels are essentially equally populated is justified.

It is generally found that the dominant mechanism for singlet-triplet interconversion at zero and low fields is HFI-induced intersystem crossing. (Steiner, U. E.; Ulrich, T. Chem. Rev. 1989, 89, 51–147.; Steiner, U. E. et al. Photochemistry and Photophysics, Vol IV; Rabek, J. F., Ed.; CRC: Boca Raton, Fla., 1991; pp 1–130.; Hayashi, H. Photochemistry and Photophysics, Vol I; Rabek, J. F., Ed.; CRC: Boca Raton, Fla., 1990; pp 59–136.; Grissom, C. B. Chem. Rev. 1995, 95, 3–24). At zero field, the four spin levels are essentially isoenergetic, and HFI-induced intersystem crossing rapidly equilibrates all four states. As the magnetic field strength increases and the Zeeman interaction splits the energies of $T_+$ and $T_-$ away from those of $T_0$ and S (FIG. 6), HFI-induced intersystem crossing to $T_+$ and $T_-$ becomes slower. Finally these two states are no longer populated, and the magnetic field effect saturates. Weller and coworkers have shown (Weller, A. et al. Chem. Phys. Lett. 1193, 96, 24–27) that for a series of organic radical pairs, the magnetic field value at half saturation due to HFI, $B_{1/2}$ is given by:

$$B_{\frac{1}{2}} = 2\frac{B_1^2 + B_2^2}{B_1 + B_2} \tag{5}$$

where $B_1$ and $B_2$ refer to the energies of the hyperfine interactions between the nuclear spins and unpaired electron spins on each radical. These may be determined from the values of the isotropic hyperfine coupling constants $a_{ik}$. For the current example, where tile dominant hyperfine interactions are with protons (I=½), the value of $B_i$ is given by:

$$B_i\left(\sum_k I(I+1)a_{ik}^a\right)\Big)^{\frac{1}{2}} = \left(\sum_k \frac{3a_{ik}^2}{4}\right)^{\frac{1}{2}} \tag{6}$$

In the case of triad 1, the fullerene moiety is expected to contribute negligibly because there are few, if any, hyperfine coupling interactions with protons. This is consistent with the narrow epr line width of this radical (~0.1 mT). (Zoleo, A. 1995. Dissertation, Universita di Padova). The large number of hyperfine couplings in the carotenoid radical cation, which lead to a broad epr signal, are expected to dominate $B_{1/2}$. The proton hyperfine coupling constants for β-carotene have been determined. (Piekara-Sady, L. et al. Chem. Phys. Lett. 1991, 186, 143–148). Using these values to estimate those for the carotenoid of 1, then $B_{car}$ is 3.4 mT, and eq 5 yields a $B_{1/2}$ value of 6.8 mT, which is in good agreement with the experimental value of 6.4 mT (FIG. 4). This result is consistent with the assignment of HFI-induced intersystem crossing as the major intersystem crossing mechanism.

In the presence of magnetic fields, the spin rephasing (Δg) mechanism can also interconvert the $S_0$ and $T_0$ states. This mechanism relies on the difference in precession frequencies of the electron spins in the biradical ($\Delta g$) that arises from differences in chemical environments (first term in eq 2). The time for interconversion of the $S_0$ and $T_0$ states by this mechanism ($\Delta\omega$) is given (Grissom, C. B. Chem. Rev. 1995, 95, 3–24) by:

$$\Delta\omega=\Delta g\beta B/h \quad (7)$$

The g values for the carotenoid radical cation and fullerene radical anion are 2.0027 and 1.998, respectively. (Zoleo, A. 1995. Dissertation, Universita di Padova.; Grant, J. L. et al. J. Am. Chem. Soc. 1988, 110, 2151–2157.; Hasharoni, K. et al. J. Am. Chem. Soc. 1990, 112, 6477–6481). At the field where the magnetic field effects in 1 saturate, ~0.020 mT, $1/\Delta\omega$ equals 120 ns. Thus the $\Delta g$ mechanism could have some effect on $S_0$–$T_0$ interconversion at the higher magnetic field strengths, although the HFI mechanism dominates overall, as discussed above.

Spin-orbit coupling can also in principle lead to interconversion among spin states in biradicals. Spin-orbit coupling is most important for heavy atoms, and interconversion by spin-orbit coupling is expected to be too slow to be significant in triad 1 at 77 K. The fact that a magnetic field effect is observed at all, and that it saturates at low magnetic fields shows that rapid interconversion of all spin states by spin-orbit coupling or any other mechanism is not, in fact, occurring under these conditions.

At 298 K, no effect of small magnetic fields on the lifetime of $C^{*+}$-P-$C_{60}^{*-}$ is observed in organic solvents. Thus, under these conditions, rapid equilibration among the various spin sublevels must be occurring even in the presence of the field. It is possible that properties of the fullerene radical anion contribute to the high equilibration rate.

The treatment above assumes that all singlet-triplet interconversion occurs in the $C^{*+}$-P-$C_{60}^{*-}$ biradical. Given the 770 ps rise time of this state at 77 K, it is conceivable that some interconversion could also happen in the precursor $C^{*+}$-P-$C_{60}^{*-}$, although the radicals are presumably much more strongly coupled in this state. If this occurs, it has no significant consequences. The yield of $C^{*+}$-P-$C_{60}^{*-}$ is essentially the same at 77 K and ambient temperature, where the rate of formation of $C^{*+}$-P-$C_{60}^{*-}$ is much too fast to permit intersystem crossing in the precursor biradical. The yield of $C^{*+}$-P-$C_{60}^{*-}$ at 77 K is also independent of magnetic field strength. This suggests that singlet-triplet interconversion in $C^{*+}$-P-$C_{60}^{*-}$ is not affecting the competition between steps 4 and 7 in FIG. 1.

Triad 1 provides a unique opportunity to observe a straightforward influence of weak magnetic fields on radical pair recombination, and the expected 50% increase in the lifetime of the charge-separated state. There are several reasons for this situation. In the first place, 1 generates the charge-separated state via a multistep electron transfer strategy that produces a long-lived charge-separated state in high yield, but with only a small exchange interaction between the radicals. This weak coupling permits singlet-triplet interconversion by hyperfine interactions of the electron spins with nuclear magnetic moments. Presumably, these are mainly the hydrogen atoms on the carotenoid chain. Secondly, charge separation occurs in a rigid glass at 77K (electron transfer occurs down to at least 8 K in 1), and this establishes the conditions for rapid equilibration of the S and $T_0$ states with no population of $T_+$ and $T_-$ in the presence of the magnetic field. Finally, charge recombination yields exclusively the carotenoid triplet state. If recombination occurred only to the singlet ground state, the lifetime of the charge-separated state would be reduced by the magnetic field.

As mentioned above, there are numerous examples of magnetic field effects on reaction yields in mobile radical ion pairs (MARY effect). (see: Steiner, U. E. et al. Chem. Rev. 1989, 89, 51–147.; Steiner, U. E. et al. Photochemistry and Photophysics, Vol IV; Rabek, J. F., Ed.; CRC: Boca Raton, Fla., 1991; pp 1–130.; Hayashi, H. Photochemistry and Photophysics, Vol I; Rabek, J. F., Ed.; CRC: Boca Raton, Fla., 1990; pp 59–136.; Grissom, C. B. Chem. Rev. 1995, 95, 3–24). Examples with rigid systems are less common. Effects related to those reported here have been observed in photosynthetic reaction center preparations, where large-scale motions within the protein matrix are restricted. In reaction centers of Rhodobacter sphaeroides excitation of the special pair of bacteriochlorophyll molecules is followed by photoinduced electron transfer via a bacteriochlorophyll monomer to a bacteriopheophytin. An electron then migrates to a quinone acceptor $Q_A$, and finally to a second quinone $Q_B$. If $Q_A$ is pre-reduced so that it cannot act as an acceptor, a long-lived radical pair consisting of the special pair radical cation and bacteriopheophytin radical anion is formed. The singlet radical pair can recombine to yield the ground state, or undergo intersystem crossing to the triplet radical pair, which decays to yield the triplet state of the special pair. In the presence of a magnetic field of 50 mT, the yield of triplet chromophore decreases by ~50%. (Blankenship, R. E. et al. Biochim. Biophys. Acta 1977, 461, 297–305.; Hoff, A. J. et al. Biochim. Biophys. Acta 1977, 460, 547–554). The genesis of this effect is that at zero field, the singlet radical pair can interconvert rapidly with the three triplet sublevels by hyperfine interactions. In the presence of the field, interconversion only occurs between the singlet and $T_0$ levels, as discussed above, and therefore charge recombination to the ground state is enhanced. Other effects are observed at much higher field strengths.

A magnetic field effect on quantum yields such as that found in reaction centers can only be observed if radical pair recombination can occur by two competing mechanisms. In triad 1, this is precluded because charge recombination yields only the carotenoid triplet state, but lifetime effects are observed. A somewhat related situation has been observed in modified bacterial reaction centers at temperatures below ~70 K. Under these conditions, electron transfer proceeds to yield a radical pair consisting of the special pair radical cation and the $Q_A$ radical anion, but further electron transfer is blocked. Charge recombination occurs only from the singlet radical pair to yield the ground state, as the special pair triplet state is energetically inaccessible. At fields of 50 mT, the initial part of the nonexponential decay of the radical pair to the ground state shows an increase in decay rate, attributable to decreased interconversion of the S and $T_0$ states with the $T_+$ and $T_-$ states.

Magnetic field effects at ambient temperatures have been reported in triad photosynthetic model systems consisting of two covalently linked porphyrins, one of which bears an aromatic imide electron acceptor, (see: Werner, U. et al. J. Phys. Chem 1995, 99, 13930–13937). The decay to the ground state of the biradical resulting from photoinduced electron transfer is biphasic, and the rate of the initial part of the decay increases in the presence of a very small (5 mT) magnetic field. This effect, which is quite different from those observed for 1, is ascribed to an initial decay of the singlet biradical to both the ground state and the triplet manifold, with comparable rate constants. Eventually a dynamic equilibrium is established, giving rise to a slower component. The magnetic field decreases the rate of intersystem crossing, thus affecting the rate constants and enhancing singlet decay to the ground state at early times. In these systems, magnetic field effects are not observed when the charge separation lifetime is longer than a few hundred ns.

The magnetic field effects observed for 1 are potentially useful in two ways. In the first place, the enhanced lifetime of a charge-separated state induced by the magnetic field could in principle be of value in solar energy conversion applications of artificial reaction centers. A longer lifetime could increase the quantum yield of useful energy conversion reactions by slowing down charge recombination. Of course, this is only a 50% effect, and is observable only at low temperatures in 1.

The ability to significantly slow charge recombination by application of a small field could be the basis of a magnetically controlled optical or optoelectronic switch or logic gate. The change in absorption of the carotenoid radical cation at 980 nm, monitored either at the time of maximum difference in the curves with the field on and the field off (FIG. 5a), or as the integral of the absorptions over their lifetimes (FIG. 5b), is much larger than the noise level in these experiments. Appropriate monitoring of this transient absorption with a probe light beam and a detector with a suitable threshold would allow implementation of an AND gate-like function. In its unperturbed resting state, a collection of triads would have no detectable absorption at 980 nm, as no light is absorbed by the ground state in this spectral region. Switching on the magnetic field would not generate an absorption. Excitation in the absence of a magnetic field would generate a signal below the detection threshold. However, excitation in the presence of the field would produce a measurable signal, and therefore a change in the state of the device. Thus, an output signal would be produced only in the simultaneous presence of two inputs, the magnetic field and the excitation pulse, as required for an AND gate. A similar device with an electrical readout could be devised if electron transfer from the charge-separated state of the triad to an external circuit competed with decay to the carotenoid triplet state. The electrical signal would be larger in the presence of the magnetic field, when recombination to the triplet was slowed.

EXPERIMENTAL SECTION

Transient absorption measurements on the picosecond time scale were made using the pump-probe technique. The sample was dissolved in purified 2-methyltetrahydrofuran and the resulting ~0.001 M solution was placed in a cuvette having a 2-mm path length in the beam area and stirred. For low-temperature measurements, a closed-circuit helium refrigerator from APD Cryogenics Inc. equipped with a Model 330 temperature controller from Lake Shore Cryogenics was used. Excitation was at 590 nm with 150–200 fs, 30 μJ pulses at a repetition rate of 540 Hz or with 100–150 fs, 5 μJ pulses at a repetition rate of 1000 Hz. The signals from the continuum-generated white-light probe beam were collected by an optical spectrometric multichannel analyzer with a dual diode array detector head. (Lin, S. et al. Biophysical Journal 1994, 66, 437–445).

For nanosecond transient absorption measurements, similar solutions were placed in a cuvette with a 1-cm path length. For measurements at ambient temperatures, the sample was deoxygenated by purging with argon. The transient absorption measurements were made with excitation from an Opotek optical parametric oscillator pumped by the third harmonic of a Continuum Surelight Nd:YAG laser. The pulse width was ~5 ns, and the repetition rate was 10 Hz. The detection portion of the spectrometer has been described elsewhere. (Davis, F. S. et al. Rev. Sci. Instrum. 1987, 58, 1629–1631).

Magnetic fields were generated using Helmholtz coils. The sample, sealed in a cuvette, was immersed in liquid nitrogen in a clear glass dewar flask. The magnetic field was measured at the sample using a Bell Gaussmeter (calibrated to ±3%).

From the foregoing it is readily apparent that a new and useful embodiment of the present invention has been herein described and illustrated which fulfills all of the aforestated objects in a remarkably unexpected fashion. It is, of course, understood that such modification, alterations and adaptations as may readily occur to the artisan confronted with this disclosure are intended within the spirit of this invention which is limited only by the scope of the claims appended hereto.

What is claimed is:

1. A magnetically activated optoelectronic logic gate comprising:

a. means for receiving and storing ultraviolet or visible wavelength and magnetic field signals wherein the means further comprises a photoreactive molecule capable of forming transient species when activated by said electromagnetic radiation signal, the lifetime of said transient species being modified in the presence of a magnetic field; and b. means for selectively accessing said stored signals to deliver said selected signals for signal processing.

2. The optoelectronic logic gate of claim 1 wherein said photoreactive molecule comprises an electron donor, an electron acceptor and a chromophore.

3. The optoelectronic logic gate of claim 1 wherein said electron donor is a carotene.

4. The optoelectronic logic gate of claim 1 wherein said electron acceptor is a fullerene.

5. The optoelectronic logic gate of claim 1 wherein said chromophore is a porphyrin.

6. The optoelectronic logic gate of claim 1 wherein said photoreactive molecule comprises a carotene, a fullerene and a porphyrin.

7. The optoelectronic logic gate of claim 1 wherein said transient species is a long-lived charge-separated molecule capable of decaying by radical pair recombination to yield the triplet state.

8. The optoelectronic logic gate of claim 3 wherein the lifetime of said transient species is extended by application of a magnetic field.

9. A means for generating magnetic field signals to the transient species of claim 1 comprises a Helmholtz coil in magnetic contact with said transient species.

10. The optoelectronic logic gate of claim 1 comprising in addition a means for selectively controlling the time period during which said magnetic signals are generated.

11. The optoelectronic logic gate of claim 1 wherein said means for selectively accessing and delivering said stored signals for signal processing comprises:

a. means for activating said transient species;

b. means for applying a magnetic field to said transient species for a selected period of time;

c. means for transmitting an optoelectronic radiation signal through said transient species;

d. means for receiving the transmitted optoelectronic radiation signal in the presence of the magnetic field, wherein processing of said transmitted electromagnetic radiation signal comprises comparison of said received signal to a threshold value to provide a Boolean yes/no signal.

12. The optoelectronic logic gate of claim 7 wherein said electromagnetic radiation signal is light of a known wavelength and the difference between incident and transmitted signal is the absorbance or per cent transmission of said light.

13. The optoelectronic logic gate of claim 7 wherein said electromagnetic radiation signal is electronic and said difference between said incident and transmitted signal is the conductance or capacitance of said electronic signal.

14. A digital device comprising the magnetically controlled logic gate of claim 1 wherein processing of said transmitted electromagnetic radiation signal comprises comparison of said signal to a threshold value to provide a Boolean yes/no signal.

15. A magnetically controlled optoelectronic logic gate of claim 1 comprising:

a. a photoreactive molecule capable of forming transient species when activated by an electromagnetic radiation signal, the lifetime of said transient species being altered in the presence of a magnetic field;

b. means for activating said photoreactive molecule to form said transient species;

c. means for delivering a magnetic field signal to said transient species for a selected period of time;

d. generator means for transmitting an optoelectronic signal through said transient species;

e. monitor means for detecting the transmitted optoelectronic signal in the presence and absence of magnetic field signal; and f. output means for delivering signals from said monitor means to a signal processor.

16. The logic gate of claim 11 in a computer processor.

*17. A system, comprising:*

*a light-producing element;*

*a magnetic field generator configured to produce a magnetic field;*

*a photoreceptive molecule comprising a chemical structure excitable to a transient state in response to light, wherein the transient state is maintainable by the chemical structure upon exposure to the magnetic field, and*

*a detector configured to be responsive to the photoreceptive molecule, and configured to provide a first signal upon exhibition of the transient state by the photoreceptive molecule and to provide a second signal upon exhibition of a ground state by the photoreceptive molecule.*

*18. The system of claim 17, wherein the light has a wavelength between a visible spectrum and an ultraviolet spectrum.*

*19. The system of claim 17, wherein the photoreceptive molecule further includes an electron donor, an electron acceptor, and a chromophore.*

*20. The system of claim 19, wherein the electron donor is a carotene.*

*21. The system of claim 19, wherein the electron acceptor is a fullerene.*

*22. The system of claim 19, wherein the chromophore is a poryphyrin.*

*23. The system of claim 17, wherein the magnetic field generator comprises a coil.*

*24. The system of claim 17, wherein the photoreceptive molecule exhibits increased light absorption in the transient state, and wherein the detector is further configured to detect the increased light absorption to provide the first signal.*

*25. The system of claim 24, wherein the detector is configured to measure the increased light absorption at a wavelength of 980 nm.*

*26. The system of claim 17, wherein the photoreceptive molecule in the transient state has an increase in electrical energy, and wherein the detector is configured to produce the first signal responsive to the increase in electrical energy.*

*27. A computer processor, comprising:*

*a photoreceptive molecule having a chemical structure of the type to exhibit a transient state in response to light, wherein a time period of the transient state is extendable upon exposure to a magnetic field; and*

*a measurement device configured to detect whether the photoreceptive molecule is in the prolonged transient state, and wherein the measurement device is configured to provide a first signal upon exhibition of the transient state by the photoreceptive molecule and to provide a second signal upon exhibition of a ground state by the photoreceptive molecule.*

*28. The computer processor of claim 27, further comprising a magnetic field generator configured to produce the magnetic field.*

*29. The computer processor of claim 27, further comprising a light-producing element to emit light.*

*30. The computer processor of claim 29, wherein the light-producing element comprises a fiber-optic communication line.*

*31. The computer processor of claim 27, wherein the photoreceptive molecule comprises an electron donor, an electron acceptor, and a chromophore.*

*32. The computer processor of claim 31, wherein the electron donor is a carotene.*

*33. The computer processor of claim 31, wherein the electron acceptor is a fullerene.*

*34. The computer processor of claim 31, wherein the chromophore is a poryphyrin.*

*35. A solar light energy conversion system, comprising:*

*a magnetic field generator configured to provide a magnetic field for a period of time,*

*a photoreceptive molecule comprising a chemical structure excitable to a transient state, wherein the photoreceptive molecule has a protracted transient state upon exposure to the magnetic field, and*

*an energy-storing element configured to receive energy produced by the photoreceptive molecule upon a transition of the photoreceptive molecule from the protracted transient state to a ground state.*

*36. The solar energy conversion system of claim 35, wherein the photoreceptive molecule comprises an electron donor, an electron acceptor, and a chromophore.*

*37. The solar energy conversion system of claim 36, wherein the electron donor is a carotene.*

*38. The solar energy conversion system of claim 36, wherein the electron acceptor is a fullerene.*

*39. The solar energy conversion system of claim 36, wherein the chromophore is a poryphyrin.*

*40. The solar energy conversion system of claim 35, wherein the magnetic field generator comprises a coil.*

*41. A method, comprising:*

*generating a magnetic field during a time period;*

*detecting a transient state of a photoreceptive molecule having a chemical structure excitable to the transient state in response to light, wherein the photoreceptive molecule maintains the transient state of the photoreceptive molecule during the time period of the magnetic field, and*

*providing a first signal when the photoreceptive molecule exhibits the transient state, and providing a second signal when the photoreceptive molecule exhibits a ground state.*

*42. The method of claim 41, wherein the photoreceptive molecule comprises an electron donor, an electron acceptor, and a chromophore.*

*43. The method of claim 42, wherein the electron donor is a carotene.*

*44. The method of claim 42, wherein the electron acceptor is a fullerene.*

*45. The method of claim 42, wherein the chromophore is a poryphyrin.*

*46. The method of claim 41, wherein the magnetic field is generated by a coil.*

*47. An electric network, comprising:*

*a photoreceptive molecule having a chemical structure that is excitable to a transient state responsive to light, wherein the photoreceptive molecule has a prolonged transient state upon exposure to a magnetic field; and*

*a measurement device configured to monitor the photoreceptive molecule and to provide a first signal upon exhibition of the prolonged transient state by the photoreceptive molecule and to provide a second signal upon exhibition of a ground state by the photoreceptive molecule.*

*48. The electric network of claim 47, wherein the photoreceptive molecule comprises an electron donor, an electron acceptor, and a chromophore.*

*49. The electric network of claim 48, wherein the electron donor is a carotene.*

*50. The electric network of claim 48, wherein the electron acceptor is a fullerene.*

*51. The electric network of claim 48, wherein the chromophore is a poryphyrin.*

*52. The electric network of claim 47, further comprising a magnetic field generator.*

*53. The electric network of claim 47, further comprising a light-producing element.*

*54. A switch, comprising:*

*a photoreceptive molecule including a chemical structure excitable to a transient state in response to light, wherein a length of time that the photoreceptive molecule is in the transient state depends upon the photoreceptive molecule's exposure to a magnetic field, and*

*a detector configured to be responsive to the photoreceptive molecule, and configured to provide a first signal upon exhibition of the transient state by the photoreceptive molecule and to provide a second signal upon exhibition of a ground state by the photoreceptive molecule.*

*55. The switch of claim 54, wherein the chemical structure of the photoreceptive molecule is excitable to the transient state in response to either ultraviolet light or visible light.*

*56. The switch of claim 54, wherein the photoreceptive molecule further comprises an electron donor, an electron acceptor, and a chromophore.*

*57. The switch of claim 56, wherein the electron donor is a carotene.*

*58. The switch of claim 56, wherein the electron acceptor is a fullerene.*

*59. The switch of claim 56, wherein the chromophore is a poryphyrin.*

*60. The switch of claim 54, wherein the photoreceptive molecule, exhibits increased light absorption in the transient state, and wherein the detector is further configured to detect the increased light absorption to provide the first signal.*

*61. The switch of claim 60, wherein the detector is configured to measure the increased light absorption at a wavelength of 980 nm.*

*62. The switch of claim 54, wherein the photoreceptive molecule causes an increase in electrical energy in the transient state and wherein the detector is configured to produce the first signal responsive to the increase in electrical energy.*

* * * * *